United States Patent [19]

Willer

[11] Patent Number: 4,963,394
[45] Date of Patent: Oct. 16, 1990

[54] METHOD FOR PRODUCING THIN METAL FILMS BY VAPOR-DEPOSITION

[75] Inventor: Josef Willer, Oberschleissheim, Fed. Rep. of Germany

[73] Assignee: Siemens Aktiengesellschaft, Berlin and Munich, Fed. Rep. of Germany

[21] Appl. No.: 336,884

[22] Filed: Apr. 12, 1989

[30] Foreign Application Priority Data

Apr. 12, 1988 [DE] Fed. Rep. of Germany ....... 3812141

[51] Int. Cl.$^5$ ............................................. C23C 16/00
[52] U.S. Cl. ........................................ 427/250; 427/8; 427/255.1
[58] Field of Search .......................... 427/250, 255.1, 8

[56] References Cited

U.S. PATENT DOCUMENTS

| | | | |
|---|---|---|---|
| 3,085,913 | 4/1963 | Caswell | 427/250 |
| 3,248,256 | 4/1966 | Dudo et al. | 427/255.3 |
| 3,639,165 | 2/1972 | Rairden | 427/250 |
| 3,874,922 | 4/1975 | Mickelsen | 427/250 |
| 4,129,167 | 12/1978 | Sigsbee | 427/250 |
| 4,172,156 | 10/1979 | Ritter et al. | 427/250 |
| 4,256,780 | 3/1981 | Gaerttner et al. | 427/38 |
| 4,331,702 | 5/1982 | Hieber et al. | 427/10 |
| 4,395,313 | 7/1983 | Lindsay et al. | 427/250 |
| 4,676,999 | 6/1987 | Furukawa et al. | 427/250 |
| 4,720,401 | 1/1988 | Ho et al. | 427/250 |

FOREIGN PATENT DOCUMENTS 3004149 8/1981 Fed. Rep. of Germany .
3405625 8/1985 Fed. Rep. of Germany .

Primary Examiner—Norman Morgenstern
Assistant Examiner—Sadie Childs
Attorney, Agent, or Firm—Hill, Van Santen, Steadman & Simpson

[57] ABSTRACT

A method for producing thin metal films by vapor-deposition or vacuum metallization in a recipient wherein the partial pressure of the water vapor is set at the beginning of and during the process of vapor-deposition so that the metal layer is deposited in a controlled fashion such that the mechanical stresses occurring in the metal layer are minimum.

20 Claims, 2 Drawing Sheets

METHOD FOR PRODUCING THIN METAL FILMS BY VAPOR-DEPOSITION

BACKGROUND OF THE INVENTION

The present invention relates to a method for producing thin metal films by thermal vapor-deposition.

Thin metal films, typically having a thickness of 10 nm to about 10 µm, can be economically produced through thermal vapordeposition (or evaporation, vacuum metallization). This method is utilized, for example, in the microelectronics area, wherein the metal contacts on the semiconductor components are constructed from one or more metal films that are deposited on top of one another.

During the deposition of such metal films, an inner mechanical stress (intrinsic stress) occurs. This inner mechanical stress limits the selection of the metals that can be utilized and the maximum thickness of the metal layer. The mechanical stress that occurs in the metal film, in particular, has the following disadvantages: it can cause the substrate to arc or sag; it can cause the adhesion of the metal film on the semiconductor surface to be deteriorated; and the electrical properties of the component can thereby be changed.

This mechanical stress can be either a compressive stress or a tensile stress. Typically, the method utilized to attempt to control the mechanical stresses is through the mutual compensation of layers having alternating compressive stress and tensile stress. G.E. Henlein and W.R. Wagner, J. Appl. Phys. 54, 6395 (1983) describes such a compensation method in a titanium-platinum layer format. The layer thicknesses are adapted, to one another, such that the inner tensile stresses of the titanium layer are compensated for by the inner compressive stresses of the platinum layer.

In a method referred to as deposition by sputtering, the stresses on the metal layer to be applied, are controlled by the pressure of the plasma, generally argon. However, this cannot be utilized in the thermal vapor-deposition (for vacuum metallization) of the metal film.

SUMMARY OF THE INVENTION

The present invention provides a method through which the intrinsic stress of a metal film that is produced by thermal vapordeposition can be set.

To this end, pursuant to the present invention, a method for producing thin metal films by thermal vapor-deposition (or evaporation, or vacuum metallization) in a recipient is provided. Pursuant to the method, the partial pressure of an auxiliary gas in the vapor-deposition chamber recipient, is set such that during the duration of the vapor-deposition, the mechanical stress occurring in the deposited metal layer lies within a prescribed range.

In an embodiment, the partial pressure of the auxiliary gas in the recipient is measured via a pressure gauge means and a means for setting the part±al pressure is provided. The partial pressure of the auxiliary gas is set with the means for setting, such that at the beginning of and during the process of vapordeposition, the mechanical stress occurring in this deposited metal layer lies within a prescribed range. In a further embodiment, the auxiliary gas is introduced from a container connected to the recipient and the means for setting the partial pressure of the auxiliary gas is a metering valve. In another embodiment, the means for setting the partial pressure of the auxiliary gas is a control system connected to the pressure gauge means.

In an embodiment of the method, the metal to be vapordeposited has an oxygen affinity that assures a prescribed, minimum efficiency utilizing the method.

In an embodiment of the method, the partial pressure of the auxiliary gas is maintained so that it is constant during the vapor-deposition of the metal layer.

In an embodiment of the method, the metal to be vapordeposited is a transition metal.

In an embodiment of the method, the metal to be vapordeposited is chosen from the group consisting of molybdenum, titanium, vanadium, zirconium, niobium, hafnium, tantalum, tungsten, nickel, and aluminum.

In an embodiment of the method, the metal to be vapordeposited is chosen from the group consisting of manganese, ruthenium, rhenium, osmium, iridium, and lanthanum.

In an embodiment of the method, molybdenum is used for the vapor-deposition, a metal layer having a layer thickness of less than approximately 150 nm is vapor-deposited and the deposition rate during the process does not exceed approximately 1 nm/s, the partial pressure of the auxiliary gas at the beginning of the vapor-deposition is set between approximately $4 \cdot 10^{-4}$ Pa to about $2.5 \cdot 10^{-3}$ Pa and is maintained within this range during the vapor-deposition.

In an embodiment of the method, the partial pressure of the auxiliary gas is set to less than approximately $1.3 \cdot 10^{-4}$ Pa before the initiation of the vapor-deposition and the partial pressure of the auxiliary gas is increased to such an extent during the vapor-deposit process that, given a prescribed layer thickness of the metal layer to be vapor-deposited and given a prescribed deposition rate, the mechanical stress of the vapor-deposition metal layer lies within a prescribed range.

In an embodiment of the method, the auxiliary gas is water vapor.

In an embodiment of the method, the auxiliary gas contains ammonia.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

The present invention provides a method for producing thin metal films by thermal vapor-deposition (or vacuum metallization, or evaporation Pursuant to the method intrinsic stresses of the metal film reduced.

The present invention is based on the observation that the partial pressure of the water vapor present in the vapor-deposition chamber, the recipient, has an influence on the mechanical stress occurring during the deposition of the vapor-deposited metal film. The method of the present invention teaches how the partial pressure of an auxiliary gas can be designationally utilized in the recipient for controlling the mechanical stress in the vapor-deposited metal films. To this end, an auxiliary gas is used that can be water vapor, that is usually always present in a certain amount in the recipient, or ammonia (NH3) or a mixture of water vapor and ammonia. In an embodiment of the method of the present invention set forth below, water vapor is utilized as the auxiliary gas.

Figure 2:
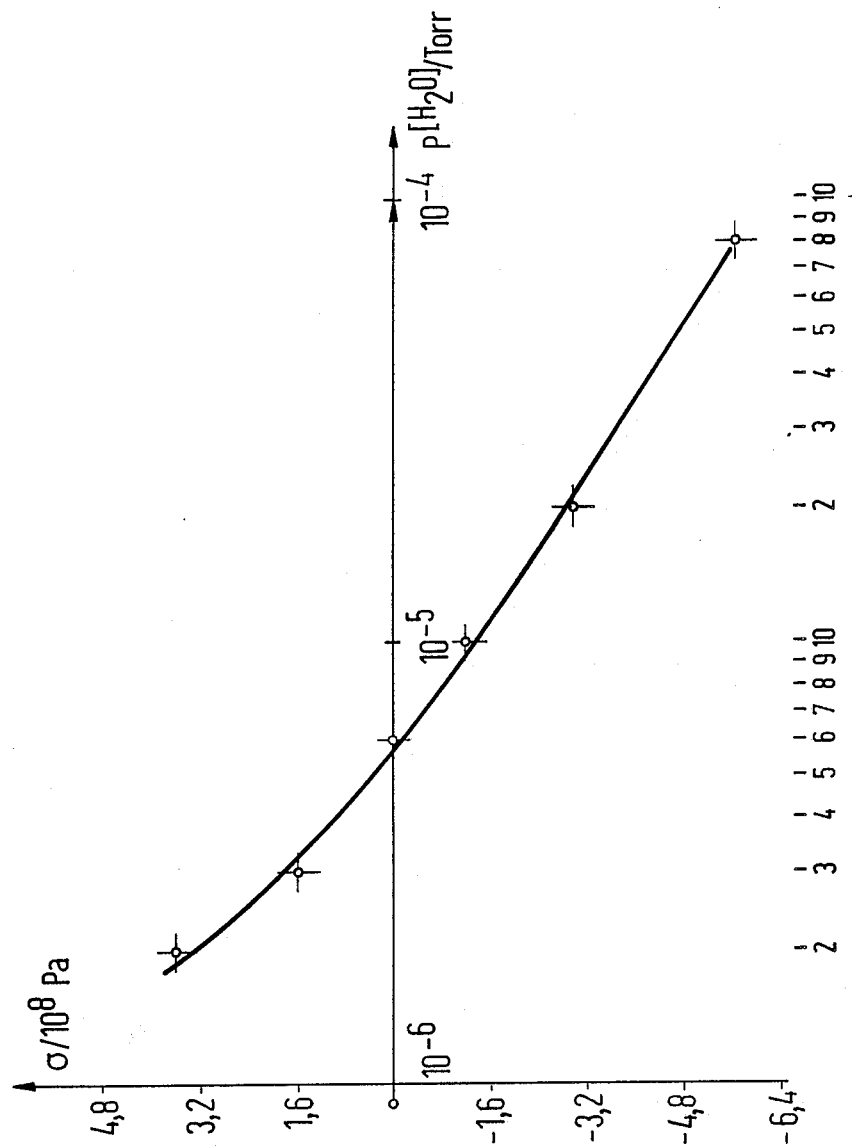
FIG. 2 illustrates graphically the relationship of mechanical stress and partial water vapor pressure.

Given a low partial water vapor pressure within the recipient, the metal layer that is vapor-deposited will have a high tensile stress. This tensile stress decreases continuously as the partial pressure of the water vapor increases. As illustrated in FIG. 2, the tensile stress is converted into a compressive stress after it crosses the zero-axis.

When the vapor-deposition process is performed utilizing a low partial pressure of water vapor, the tensile stress in the metal film consequently causes the metal film to contract relative to the substrate. This results in the component being bent. In this regard, a concave curvature will be present on the side of the metal film and a convex curvature will be present on the side of the substrate. Given compressive stress in the metal film, the component is bent or curved in exactly the opposite way.

Figure 1:
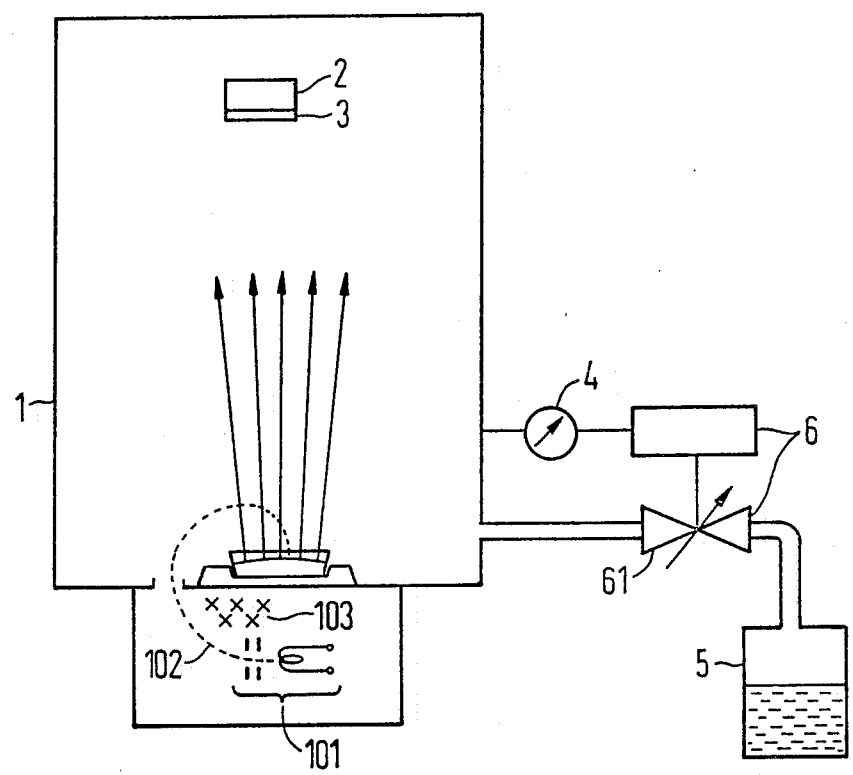
FIG. 1 illustrates schematically a structure for implementing the method of the present invention.

Referring now to FIG. 1, the substrate 2 onto which a metal film is to be vapor-deposited is located in a recipient 1. The metal, to be vapor-deposited, is located at a position opposite the substrate in a heatable vessel. The metal can be heated according to any known method for vapor-deposition processes. The device shown in FIG. 1 comprises the vessel, which is heated conventionally — for instance by inserted electrically heated wires or by inductive heating —, and by an additional equipment for electron beam heating. This equipment comprises an electron beam gun 101 and means for creating a magnetic field 103 (in FIG. 1 directing into the plane of drawing), which directs the electron beam 102 onto the metal located in the vessel. During the deposition process, due to the heating of the metal, atoms emerge (indicated by arrows) and are precipitated onto the substrate 2 as a metal film 3.

A pressure gauge means 4 is provided to determine the partial water vapor pressure in the recipient 1. Preferably, the pressure gauge means 4 is located at a position where the partial pressure of the metal to be vapor-deposited is negligible.

Pursuant to the method of the present invention, an auxiliary gas — water vapor or ammonia — is introduced into the recipient 1 from, for example, a connected container 5 — that, for example, is filled with water or NH3. The partial pressure of the auxiliary gas in the recipient 1 is set to a prescribed, constant value. If desired, the partial pressure can be set so that it varies, but has a prescribed value during the vapordeposition process. To accomplish this, in the preferred embodiment illustrated, a manually actuated metering valve 61 is provided. However, it is also possible to provide a control system 6 wherein the metering valve 61 is actuated via a controller or a control unit connected to the pressure gauge means 4. In this regard, a program-controlled control system 6 has the advantage that the partial water vapor pressure can be regulated during the vapor-deposition process in a prescribed manner as a function of the time or of the thickness of the metal film.

In order to ensure an optimum adhesion of the metal film 3 that is vapor-deposited on the substrate 2 or, respectively, on the sequence of semiconductor layers situated thereon, it i s desirable that at the beginning of the vapor-deposition process, the recipient have an optimally low water vapor constituent. Accordingly, the parts of the semiconductor surface to be coated with the metal film should thus be as dry as possible.

After a certain amount of metal has been vapor-deposited, the partial pressure of the water vapor is steadily increased. The partial pressure of the water vapor is increased to such an extent that is reaches a level that minimizes the mechanical stress in the completely deposited metal film 3. It should be noted that as long as the deposited metal film 3 is thin, a compressive stress occurs in this metal layer (cf. J. Appl. Phys. 57, 211 through 215 (1985)). A tensile stress usually occurs with the growth of the layer thickness; this tensile stress must be compensated for.

Referring now to FIG. 2, the mechanical tensile stress in the finished metal film versus the partial water vapor pressure P in the recipient is graphically illustrated. As illustrated, the value is positive when a tensile stress is present and is negative when a compressive stress is present.

The graph was produced based on measurements of a deposited metal layer of molybdenum, deposited at a rate of 500 pm/s. The thickness of the metal film was 120 nm. Six value pairs are set forth on the graph and are connected by a curve on a semi-logarithmic coordinate system. The curve describes a strictly monotonous, descending course. Tensile stress is present given low values of the partial water vapor pressure; compressive stress is correspondingly present given high values thereof. The mechanical stress occurring in the finished metal layer can be minimized by setting the partial water vapor pressure so that it falls within a neighborhood of the zero (nullstelle) of this curve.

The functional dependence of the mechanical stress which occurs in the vapor-deposited metal film on the pressure of the water vapor (or ammonia respectively) can be explained with a reactive incorporation of oxygen (or nitrogen respectively) into the deposited metal layer. The oxygen originates from the water vapor (the nitrogen from the ammonia accordingly). It is assumed that this incorporation of oxygen (or nitrogen respectively) has an influence on the grain growth in the metal layer. The method of the present invention can therefore be used for all metals that have an oxygen or, respectively, nitrogen affinity that is adequately high for this purpose. This is particularly true of the transition metals. Metals that are preferably suitable can be chosen from the group consisting of molybdenum, titanium, vanadium, zirconium, niobium, hafnium, tantalum, tungsten, nickel, aluminum, manganese, ruthenium, rhenium, osmium, iridium, and lanthanum.

In addition to the metal used, the parameters that are important with respect to the proper adjustment of the partial water vapor pressure are the layer thickness of the metal film to be vapor-deposited and the deposition rate. Under certain conditions, it may be necessary to not have a constant value for the partial water vapor pressure, but, to vary this value during the vapor-deposition process. The partial water vapor pressure in the vapor-deposition method of the present invention preferably lies between approximately $10^{-6}$ to about $10^{-4}$ Torr. The connected water reservoir 5 does not have to be heated for this purpose; rather, it can be kept at room temperature.

It should be noted that other methods can be used for controlling the partial water vapor pressure in the recipient 1.

As set forth above, pursuant to the present invention, a method is provided that makes it possible to produce a stress-free, uniform metal layer through vapor-deposition.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

I claim:

1. A method for manufacturing thin metal films by thermal vapor-deposition comprising the steps of:
   introducing a substrate to be provided with a metal film into a recipient;
   determining a range for the value of a mechanical stress that occurs in a resultant vapor-deposited metal film;
   setting the partial pressure of an auxiliary gas in the recipient so that during the duration of a vapor-deposition, the value of the mechanical stress occurring in the vapor-deposited metal film lies within a prescribed range; and
   vapor-depositing a metal film on the substrate.

2. The method of claim 1 including the steps of:
   determining the partial pressure of the auxiliary gas in the recipient by utilizing a pressure gauge means;
   providing a means for setting this partial pressure; and
   setting the partial pressure of the auxiliary gas with the means for setting at the beginning of and during the process of vapor-deposition so that the mechanical stress occurring in the deposited metal layer lies within a prescribed range.

3. The method of claim 2 including the steps of:
   introducing the auxiliary gas from a container connected to the recipient; and
   setting the partial pressure of the auxiliary gas with a metering valve.

4. The method of claim 2 including the step of setting the partial pressure of the auxiliary gas with a control system connected to the pressure gauge means.

5. The method of claim 1 including the step of vapor-depositing a metal that has an oxygen affinity that ensures a prescribed, minimum efficiency.

6. The method of claim 1 including the step of maintaining the partial pressure of the auxiliary gas constant during the vapor-deposition of the metal layer.

7. The method of claim 1 including the step of vapor-depositing a transition metal.

8. The method of claim 1 including the step of vapor-depositing a metal chosen from the group consisting of molybdenum, titanium, vanadium, zirconium, niobium, hafnium, tantalum, tungsten, nickel, and aluminum.

9. The method of claim 1 including the step of vapor-depositing a metal chosen from the group consisting of manganese, ruthenium, rhenium, osmium, iridium, and lanthanum.

10. The method of claim 1 including the steps of:
    using molybdenum for the vapor-deposition;
    depositing a metal layer having a layer thickness of less than approximately 150 nm;
    depositing the metal layer at a rate that does not exceed approximately 1 nm/s; and
    setting the partial pressure of the auxiliary gas at the beginning of the vapor-deposition at between approximately $4 \cdot 10^{-4}$ Pa to about $2.5 \cdot 10^{-3}$ and within this range during the vapor-deposition.

11. The method of claim 1 including the steps of setting the partial pressure of the auxiliary gas to less than approximately $1.3 \cdot 10^{-4}$ Pa before the beginning of the vapor-deposition and increasing the partial pressure of the auxiliary gas to such an extent during the vapor-deposition process that, given a prescribed layer thickness of the metal layer to be vapor-deposited and given a prescribed deposition rate, the mechanical stress of the vapor-deposited metal layer lies within a prescribed range.

12. The method of claim 1 including the step of using an auxiliary gas that is water vapor.

13. The method of claim 1 including the step of using an auxiliary gas that contains water vapor.

14. The method of claim 1 including the step of using an auxiliary gas containing ammonia.

15. A method for producing thin metal films by vapordeposition onto a substrate of a metal chosen from the group consisting of molybdenum, titanium, vanadium, zirconium, niobium, hafnium, tantalum, tungsten, nickel, aluminum, manganese, ruthenium, rhenium. osmium, iridium, and lanthanum, in a vapor-deposition chamber wherein the partial pressure of an auxiliary gas that contains at least one compound chosen from the group consisting of water vapor and ammonia in the chamber is set during the vapor-deposition process at a pressure that causes the mechanical stress that occurs during deposition of the metal layer to be within a prescribed range.

16. The method of claim 15 including the steps of:
    determining the partial pressure of the auxiliary gas in the recipient by utilizing a pressure gauge means;
    providing a means for setting this partial pressure; and
    setting the partial pressure of the auxiliary gas with the means for setting at the beginning of and during the process of vapor-deposit on so that the mechanical stress occurring in the deposited metal layer lies within a prescribed range.

17. The method of claim 16 including the steps of:
    introducing the auxiliary gas from a container connected to the recipient; and
    setting the partial pressure of the auxiliary gas with a metering valve.

18. The method of claim 16 including the step of setting the partial pressure of the auxiliary gas with a control system connected to the pressure gauge means.

19. The method of claim 15 including the step of vapor-depositing a metal that has an oxygen affinity that ensures a prescribed, minimum efficiency.

20. The method of claim 15 including the step of maintaining the partial pressure of the auxiliary gas constant during the vapor-deposition of the metal layer.

* * * * *